United States Patent [19]

Sheffer

[11] Patent Number: 5,045,817
[45] Date of Patent: Sep. 3, 1991

[54] FM DEVIATION CONTROL OF DIRECT DIGITAL SYNTHESIZERS

[75] Inventor: Tzafrir Sheffer, Seattle, Wash.

[73] Assignee: John Fluke Mfg. Co., Inc., Everett, Wash.

[21] Appl. No.: 579,032

[22] Filed: Sep. 7, 1990

[51] Int. Cl.⁵ .......................... H03C 3/06; H03C 3/09
[52] U.S. Cl. ..................................... 332/117; 332/119; 375/44
[58] Field of Search ............................... 332/100–105, 332/117, 119, 144; 375/44–58, 62, 64, 67; 328/14

[56] References Cited

U.S. PATENT DOCUMENTS

| | | | |
|---|---|---|---|
| 4,331,941 | 5/1982 | Kovalick et al. | 332/149 |
| 4,628,286 | 12/1986 | Nossen | 332/117 X |
| 4,757,519 | 7/1988 | Collison et al. | 332/101 X |

Primary Examiner—Siegried H. Grimm
Attorney, Agent, or Firm—John P. Dellett

[57] ABSTRACT

In a direct digital synthesizer providing a frequency modulated output the modulation input is bit shifted and the rate of the direct digital synthesizer phase accumulation is controlled to provide enhanced FM deviation resolution.

11 Claims, 2 Drawing Sheets

FM DEVIATION CONTROL OF DIRECT DIGITAL SYNTHESIZERS

BACKGROUND OF THE INVENTION

The present invention relates to a direct digital synthesizer (DDS) which provides fine deviation resolution for frequency modulation (FM) without requiring complex, costly or slow hardware.

A direct digital synthesizer is an electronic apparatus for generating cyclic waveforms by mapping discrete increment values to stored waveform data in a lookup table or memory. In a typical DDS circuit, a carrier frequency is generated by adding a constant phase increment number to an accumulation from the previous clock period. The phase accumulation is then mapped into a lookup table which addresses the corresponding cyclic waveform value, and the resulting digital waveform value is sent through a D/A converter and filtered to construct the final carrier frequency analog waveform. For frequency modulation, the phase increment input to the phase accumulator is no longer a constant but rather a function of the center frequency phase increment and a time varying phase increment corresponding to a modulation source usually multiplied by an FM deviation factor.

Frequency modulation can be implemented in various ways depending on design requirements. The simplest form of DDS frequency modulation is accomplished through the use of an adder which sums the selected carrier frequency related number with an instantaneous modulation value. The result is then used as a time variable phase increment input to the phase accumulator. This method is limited, however, due to its fixed FM frequency deviation.

To increase the controllability of FM frequency deviation, the instantaneous modulation value can be multiplied by a selected deviation factor and the product added to the selected carrier frequency related number. However, this method is usually slower and more expensive to implement due to the additional complexity of usual multiplication circuitry.

To reduce circuit complexity, an arithmetic shifter can be used instead of a multiplication unit. The arithmetic shifter serves to multiply the instantaneous modulation by a selectable deviation in powers of two. However, since bit shifters conventionally allow multiplication only in power of two increments, resolution of the FM modulation deviation is reduced, limiting the number of selectable channels that can be generated from the DDS.

The present invention relates to means for providing linear FM deviation control along with fine resolution controllability without having to use expensive, complex or slowly operating hardware.

SUMMARY OF THE INVENTION

According to the present invention in a particular embodiment thereof, DDS FM deviation is controlled using binary shifting in accordance with the DDS clock rate. By manipulating the relationship between the frequency deviation, deviation multiplication factor and the clock frequency of the DDS, increased control of the FM deviation resolution is achieved without having to employ a fully functional multiplication unit.

An initial modulation multiplication value is selected which provides an approximation of the desired deviation. A clock frequency is then selected which will refine the FM deviation frequency and essentially bring it to the desired value. The DDS center frequency and frequency resolution are suitably employed to calculate the carrier phase value. Finally, the application of the carrier phase value with the frequency modulation value can be modified to account for the asymmetrical nature of the DDS modulation source.

The circuit can be implemented utilizing a binary shifter to shift the instantaneous modulation frequency by about the predetermined modulation multiplication value. The product is added to a selected carrier frequency number and the sum is input as a phase increment to a phase accumulator. A base clock frequency is selected and varied to generate the necessary clock frequency to fine tune the desired modulation deviation. The adjusted clock frequency is applied to the phase accumulator of the DDS, with the phase accumulator output being employed to address a phase to amplitude lookup table. The output of the table lookup is latched and this output is then sent to a digital/analog converter coupled via a low pass filter for providing DDS output.

As a result, a DDS modulation circuit is achieved which allows finer deviation control of instantaneous modulation than would normally be considered obtainable with a binary shifter. The invention is designed to bridge the gap between frequency modulation techniques which are fast but have no deviation control capabilities (adder circuits) and techniques which have full FM deviation control and fine resolution capabilities but are complex and slow (i.e., conventional multiplication circuits).

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
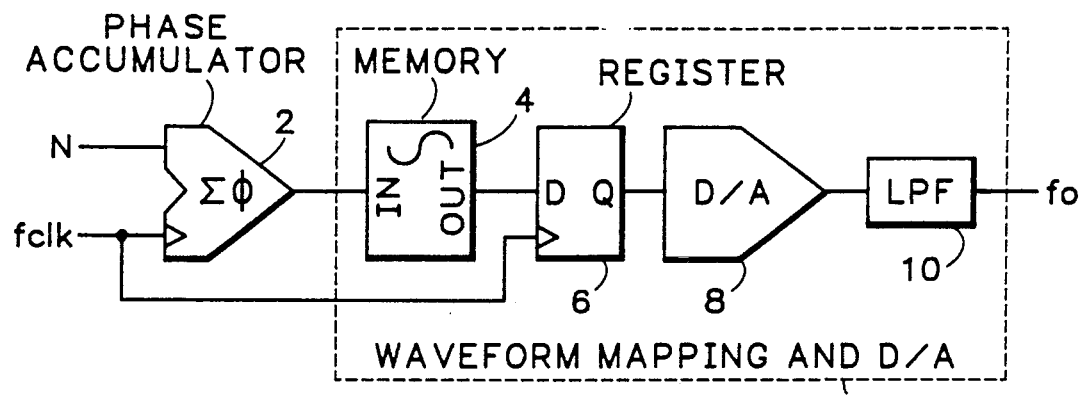
FIG. 1 is a block diagram of a conventional direct digital synthesizer of the prior art.
Figure 2:
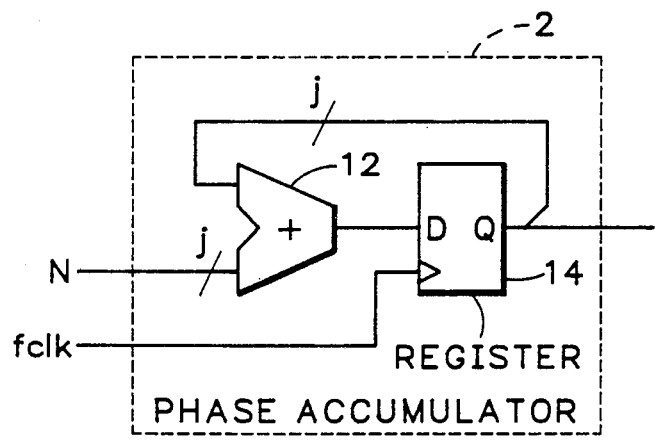
FIG. 2 is a block diagram of the components comprising a typical phase accumulator.

Referring to the drawings, and particularly to FIG. 1, the construction and operation of a prior art direct digital synthesizer will be reviewed. A phase accumulator 2 (illustrated in further detail in FIG. 2) consists of an adder 12 and a register 14. Adder 12 sums phase increment value N with the output value of register 14 from the previous clock period while register 14 latches the output of adder 12 for each clock period of $f_{clk}$. The output of register 14, as well as being fed back to adder 12, serves as the output of phase accumulator 2. Phase accumulator 2 thus increments each clock cycle by the phase increment value N.

The output of phase accumulator 2 is applied to memory 4 which maps the phase value to an associated waveform amplitude value, this phase-to-amplitude mapping serving to translate discrete phase values to amplitudes for a particular type of waveform. The amplitude value is output from memory 4 and latched in register 6 by $f_{clk}$ and, on the next clock period, is applied to digital-to-analog (D/A) converter 8. The output of the D/A converter 8 is supplied through a low pass filter 10 for removing unwanted frequency components located above the Nyquist frequency created during wave reconstruction.

The DDS output $f_o$ is a periodic waveform since adder 12 has a limited bit size j. The adder 12 output increases linearly by N every $1/f_{clk}$ seconds until the sum exceeds a maximum number of bits, j, whereupon the adder overflows and wraps to or above zero. The process of adder 12 overflowing, and then incrementing by N every clock period, allows the output of memory 8 to continuously repeat, thus creating a periodic waveform with a frequency proportional to N. The following equations establish a mathematical relationship of the basic DDS circuit for FIG. 1.

$$f_o = f_{clk}(N/2^j) \quad (1)$$

wherein $f_o$ = output frequency of the DDS (Hz),
$f_{clk}$ = phase accumulator clock frequency (Hz),
j = size of the phase accumulator (bits), and
N = integer phase increment; $(0 < = N < 2^j)$.

Increasing N increases the incremental summation for each clock cycle. In association with the frequency selection value N, the accumulator size j dictates the maximum number allowable in the adder before overflow occurs.

The maximum frequency resolution (channel spacing), is achieved when N = 1.

$$f_r = f_{clk}/2^j \quad (2)$$

The sampling theorem specified by the Nyquist criterion requires the sampling rate to be greater than twice the highest frequency component of the sampled wave and, therefore, a sinusoidal waveform imposes a maximum frequency $f_{omax}$, smaller than $f_{clk}/2$.

Referring to equation 1, the maximum value for the phase increment, $N_{max}$, is $$N_{max} < f_{omax} 2^j / f_{clk}. \quad (3)$$

Substituting $f_{clk}/2$ for $f_{omax}$, and taking into account that the DDS is processing discrete signals, the maximum phase increment, which is also the maximum number of usable tuning channels, equals:

$$N_{max} = 2^{j-1} - 1 \quad (4)$$

To utilize the full capability of a DDS system, it would be desirable to be able to achieve fine resolution between selectable channels. However, there are hardware considerations which pose limitations to obtaining a fine selectable channel frequency resolution.

Common frequency modulation methods involve applying an instantaneous modulation value to a carrier phase increment value and thereby generating a waveform deviation from a center or carrier frequency. If a deviation factor is multiplied with the modulation value, the frequency can be varied, allowing selectable modulation. A problem exists since it is computationally intensive to multiply each discrete modulation value by a deviation factor. As hereinbefore mentioned, an alternative method for multiplication of a deviation factor involves shifting the modulation value by selectable bit increments wherein a shift register or barrel shifter is used to perform the operation faster and with less hardware than a conventional multiplier. However, such a device is limited in controllability since it can only effectively multiply by powers of two. According to the present invention, high resolution controllability of the deviation factor is nevertheless achieved without the low speed and hardware complexity encountered with a conventional multiplier.

Figure 3:
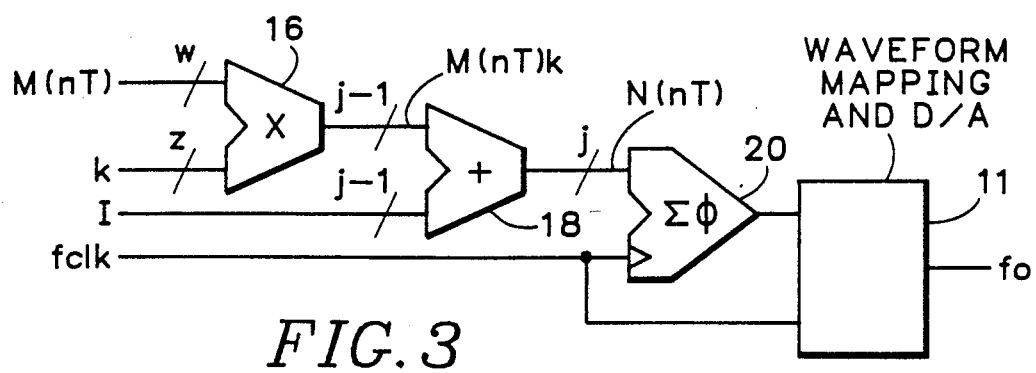
FIG. 3 is a block diagram of a direct digital synthesizer with controllable FM deviation using a multiplier.

FIG. 3 illustrates an FM modulation circuit using the DDS from FIG. 1 and a conventional multiplier. The instantaneous modulation value M(nT) is applied to multiplier 16 where it is multiplied by modulation deviation factor k. By way of example, an instantaneous modulation value can be represented as $$M(nT) = \sin(R(nT) (2\text{pi})/2^g.$$

where M(nT) is a sinusoid with a maximum amplitude of one, a phase value R(nT) and a truncated phase value g. The output of multiplier 16 represents the modulation frequency increment value M(nT)k and is coupled to adder 18. This modulation frequency increment value, when added to the center frequency phase increment value I, results in phase increment value N(nT) which is no longer a constant as in FIG. 1 but is instead a discrete time function. Phase accumulator 20 is similar to phase accumulator 2 in FIG. 1 but increments by the value of N(nT) for each clock period of $f_{clk}$. The output of phase accumulator 20 is used for addressing waveform mapping and D/A circuit 11, and outputting an FM modulated periodic waveform $f_o$. Circuit 11 corresponds to the similarly numbered portion of FIG. 1 including elements 4, 6, 8 and 10 interconnected as shown.

From FIG. 3, it can be seen that the phase increment value N(nT) is equal to:

$$N(nT) = I + kM(nT) \quad (5)$$

By substituting equation 2 into equation 1 and specifying $f_o$ in terms of a discrete time function:

$$f_o(nT) = f_r N(nT) \quad (6)$$

Then substituting equation 5 in equation 6 yields:

$$f_o(nT) = f_r(I + kM(nT)) = f_c = f_d(nT) \quad (7)$$

Equation 7 indicates two frequency components where $f_c$ is the carrier frequency and $f_d(nT)$ is the FM component or deviation frequency.

Substituting equation 2 back into equation 7 defines the deviation frequency as:

$$f_d(nT) = f_{clk} k M(nT)/2^j \quad (8)$$

Assuming the modulation source M(nT) has a maximum amplitude of one and has a symmetrical deviation centered about zero amplitude, it is seen that $f_d(nT)$ is bound to:

$$-f_{clk} k/2^j < = f_d(nT) < = +f_{clk} k/2^j \quad (9)$$

This implies a peak FM deviation value:

$$f_{dev} = f_{clk} k/2^j \quad (10)$$

If the adder size is fixed, two variables control the DDS FM deviation: the multiplier factor, k, and the clock rate, $f_{clk}$. As can be seen from equation 5, a multiplication operation associates the deviation multiplier k with the modulation source M(nT). However, as indicated previously, in comparison to an addition or shift, a multiplication operation is more complex to realize in hardware and usually requires additional clock cycles to generate a result.

Figure 4:
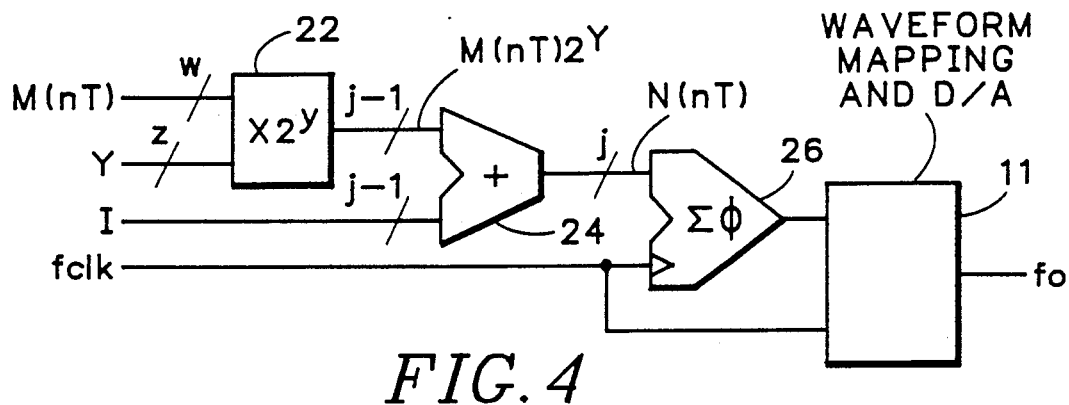
FIG. 4 is a block diagram of a direct digital synthesizer with controllable FM deviation using a binary shifter.

FIG. 4 illustrates use of a binary shifter to reduce the complexity of the hardware and the time required to control the modulation value. The instantaneous modulation value M(nT) is coupled to binary shifter 22 along with a value Y to control the number of shifts M(nT) will receive. The output of binary shifter 22 is added to the center frequency increment value I in adder 24 while the output of adder 24 serves as the time varying phase increment input to phase accumulator 26. As previously described the output of phase accumulator 26 and $f_{clk}$ are applied to waveform mapping circuit 11 (from FIG. 1) which then outputs a periodic FM waveform $f_o$.

FIG. 4 implements an approximate deviation control of the instantaneous frequency deviation by shifting M(nT) by powers of two. M(nT) is thereby multiplied by the factors . . . ¼, ½, 1, 2, 4. . . This shift method provides for simple, fast multiplication of M(nT) by a deviation factor k, where $k = 2^Y$, but since the controllability of k is restricted to powers of two, the DDS frequency resolution is limited. However, it is seen $f_{clk}$ also affects the FM deviation value (equation 10). In accordance with the present invention, the clock frequency is modified to bridge the gap between the finer resolution controllability of the standard multiplier and the speed of the binary shifter.

Figure 5:
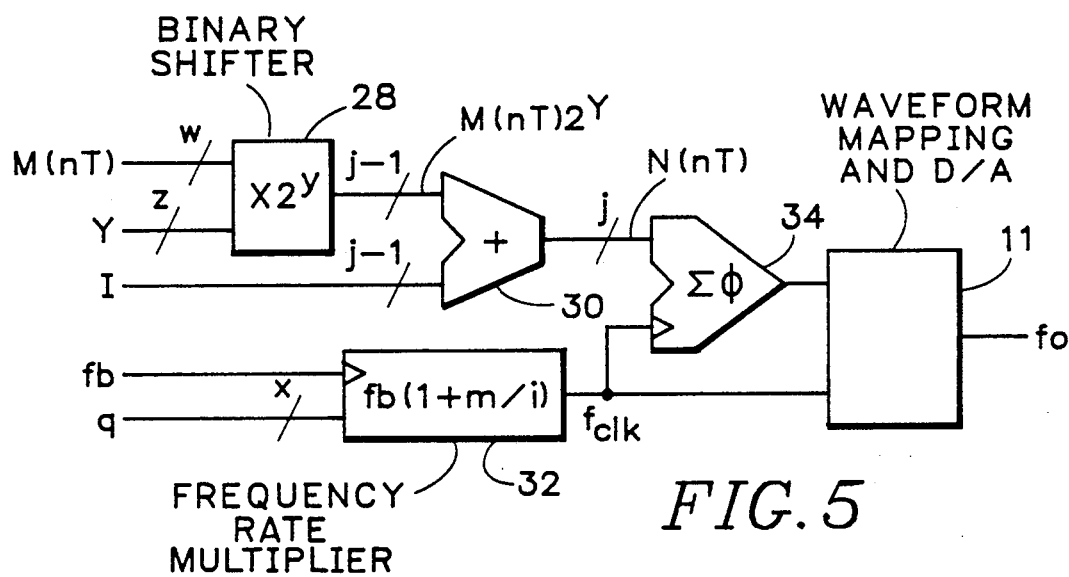
FIG. 5 is a block diagram of the present invention comprising a direct digital synthesizer with increased FM deviation controllability using a binary shifter in association with a variable frequency system clock.

FIG. 5 illustrates a circuit according to the present invention including a frequency rate multiplier 32 for providing a programmable clock frequency to the DDS modulation circuit for providing a second source of FM deviation control. Binary shifter 28 (corresponding to shifter 22 in FIG. 4) is used to shift M(nT) by a selectable number of bits, Y, and the output of binary shifter 28 again represents the modulation frequency phase increment added to the center frequency phase increment I by adder 30 (corresponding to adder 24). The output of adder 30 is the time varying phase increment value N(nT) input to phase accumulator 34 (corresponding to accumulator 26).

Frequency multiplier 32 in FIG. 5 provides a programmable clock frequency $f_{clk}$ produced in response to a base frequency input $f_b$ and a selectable base frequency multiplication factor input q, i.e. $f_{clk} = F_b(q)$. The programmable clock frequency $f_{clk}$ serves as input to phase accumulator 34 as well as to waveform mapping circuit 11 (as shown in FIG. 1), the output of mapping circuit 11 supplying the FM modulated signal $f_o$. A low cost implementation of an FM system is provided that can be designed up to the level of complexity needed, based on modulation deviation specifications.

Binary shifter 28 serves to control the modulation deviation by shifting M(nT) by Y bits resulting in a multiplication factor of $2^Y$. Frequency multiplier 32, however, refines the deviation factor created with binary shifter 28 by providing a plurality of multiplication factors between one and two times the clock frequency. The invention in using frequency controller 32 increases the resolution of the FM deviation by increasing the number of selectable frequencies.

The clock frequency is suitably expressed as a function of base frequency $f_b$, and a number of equally spaced clock frequencies, i:

$$f_{clk} = f_b(1 + m/i) \quad (11)$$

In equation 11, m is an input variable representing a positive integer between 0 and i−1, so $f_{clk}$ exists in the range:

$$f_b < = f_{clk} < = f_b(2 - 1/i) \quad (12)$$

Differentiating $f_{clk}$ in equation 11 with respect to the input variable m provides discrete clock frequency steps:

$$df_{clk}/dm = d/dm(f_b + f_b m/i) = f_b/i \quad (13)$$

The effect of the clock frequency steps on the peak FM frequency deviation increment can be calculated by substituting equation 11 in equation 10:

$$f_{dev} = f_b(1 + m/i)(k/2^j)$$

Differentiating this relation with respect to m:

$$(d/dm)f_{dev} = (d/dm)f_b(1 + m/i)(k/2^j) \quad (14)$$
$$= f_b k/(2^j i)$$

From equation 14, it is seen that the FM deviation resolution corresponding to the above clock steps, in terms of percent, is linearly proportional to i:

$$f_{dr} = 100/i \ (\%)$$

If i in equation 11 is set to ten (i = 10), equally spaced discrete frequencies $f_{clk}$ will be linearly spaced between one and two times a base frequency $f_b$:

$$f_{clk} = 1.0 f_b, 1.1 f_b, 1.2 f_b, \ldots 1.9 f_b \quad (15)$$

Therefore, discrete FM deviation multipliers of 1.1, 1.2, ... 1.9 or a resolution of 10% is provided in terms of the FM deviation value. The linear relationship between i and the FM deviation resolution is significant in allowing a controllable means for refining the binary multiplication factor. If the discrete FM deviation multipliers in equation 15 were not linearly proportional to changes in the clock frequency, increased deviation control by varying $f_{clk}$ would not be practical. For example, if i were related to $f_{clk}$ by a power of two, a linear relationship would not exist. In this case, changes in i would generate multipliers that do not proportionally cover the base frequency time period.

Figure 6:
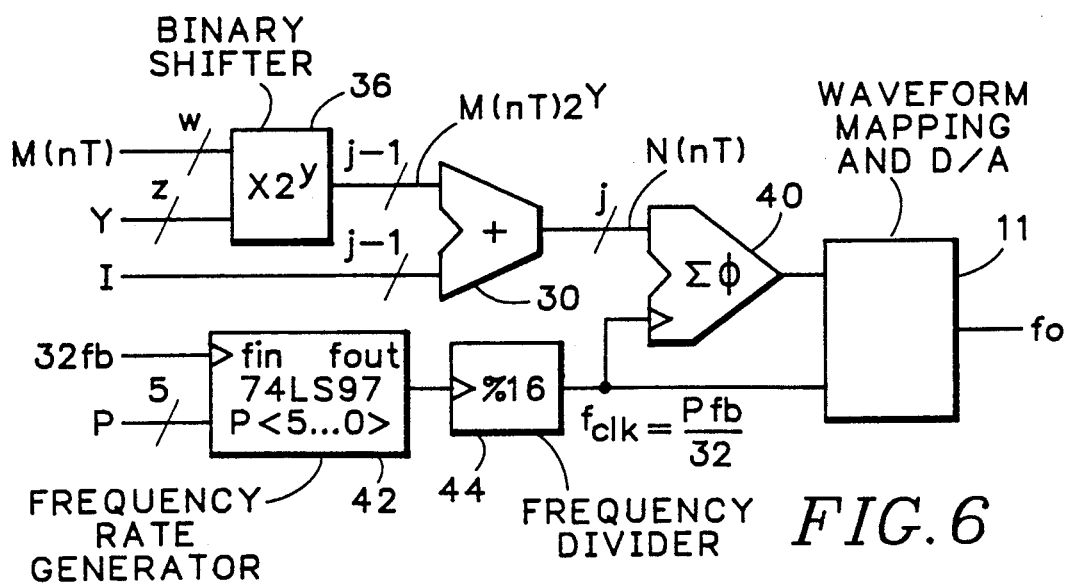
FIG. 6 is a block diagram of a design example based on the circuit in FIG. 5.

FIG. 6 further illustrates a binary shifter employed in association with a frequency rate multiplier for producing high resolution FM modulation in accordance with the present invention. The frequency rate generator 42 is suitably a 74LS97 type circuit which provides multiplication of the input frequency ($f_{in}$) by multiples of P/64. P is a selectable five bit integer input of the frequency rate multiplier which can range in value from 0 to 63. The output of the frequency rate multiplier is fed to a frequency divider 44 to reduce high frequency noise problems, and also here to demonstrate how the invention may be customized to individualized system configurations. The output of frequency divider 44 is the selected system clock input for the phase accumulator 40 and waveform mapping circuit 11.

The instantaneous modulation value M(nT) is again shifted by a selectable number of bits Y and then summed with the center frequency increment value I by adder 38, the output of adder 38 serving to supply the time variant phase increment value N(nT) for the phase accumulator 40. The phase accumulator output is applied to waveform mapping circuit 11, the output of which is the FM modulated waveform $f_o$.

The input frequency $f_{in}$ is selected to supply the maximum possible value for $f_{clk}$. From equation 12 the maximum value of $f_{clk}$ exists when $f_{clk}=f_b(2-1/i)$. When the number of equally spaced clock frequencies, i, is large, $f_{clk}$ is approximately equal to twice the base frequency, $2f_b$. Therefore, to ensure that the input frequency is large enough to generate the maximum number of equally spaced clock frequencies, $f_{in}$ was selected to be equal to twice the base frequency. The input frequency is also multiplied by 16 to account for the divide by 16 component 44 or $$f_{in}=(16)(2)f_b=32f_b.$$

From equation 12, it is seen that to allow as much resolution as possible from the rate multiplier in FIG. 6, $f_{clk}$ should be between $f_b$ and $f_b(1+(i-1)/i)$. Corresponding values of P are then between 32 and 63 which define a maximum value of i=32. If $f_{clk}$ in equation 11 is rewritten to correspond to FIG. 6, $$f_{clk} = f_b(1 + m/i) = f_b(1 + (P - 32)/32) = Pf_b/32 \quad (16)$$

where $32 <= P <= 63$.

The following example implements the circuit with given design parameters for an FM modulated carrier that has a carrier frequency of 200 KHz and a frequency deviation of 5.5 KHz (or $f_o = 200$ KHz$+/-5.5$ KHz). It is assumed the base frequency as input to the frequency generator is 5 MHz and the number of bits in the phase accumulator is 24 or, $f_c=200$ KHz,
$f_{dev}=5.5$ KHz,
$f_b=5$ MHz, and
j=24.

The deviation multiplication factor k can be calculated by substituting equation 16 into equation 10:

$$f_{dev} = f_{clk}k/2^j = (Pf_b/32)k/2^j \text{ or,} \quad (17)$$

$$Pk = 590{,}558$$

To solve for k, the lowest possible value of P is used (P=32 when $f_{clk}=f_b$) to provide k=18,450. P should be selected in accordance with k so that both parameters do not exceed hardware boundaries. Since k is generated from binary shifter 36, it is selected from the closest binary value that is smaller than 18,450. To determine P, equation 16 is used again with the value of k set to $2^{14}$, $$P=590{,}558/2^{14}=36.04.$$

or selecting the closest integer value selectable by the frequency multiplier, P=36. From the values generated for P and k, the following FM deviation setting can be achieved:

$$f_{dev} = f_{clk}k/2^{24}$$
$$= (P/32)5 \text{ MHz}(16{,}384)/2^{24} = 5.4932 \text{ KHz}$$

Although not necessary to the invention, the modulation frequency may be shifted to center about the amplitude axis. From the design parameters, the value of I in the example is specified to provide a center frequency of 200 KHz. From equation 16, the selected clock frequency is $$f_{clk}=Pf_b/32=(36)5 \text{ Mhz}/32=5.625 \text{ MHz}.$$

The maximum frequency resolution can then be derived from equation 2, $$f_r=f_{clk}/2^{24}=0.3353 \text{ Hz}.$$

To determine the center frequency phase increment value, equation 7 takes the ratio of the center frequency to the frequency resolution or, $$I=f_c/f_r=200 \text{ KHz}/0.3353 \text{ Hz}=596{,}523.$$

In FIG. 6, M(nT) is an 8 bit amplitude that has a value between 0 and 256. When the modulation value M(nT) is added to the center frequency increment value I such that they are both aligned (LSB of M(nT) corresponds to LSB of I), then the contribution of M(nT) to the phase increment value N(nT) is between 0 and 255. To provide a symmetrical FM deviation contribution, 256/2 is subtracted from I, thereby creating a variation in N from I−128 to I+127. Substituting equation 2 into equation 1:

$$f_o=(f_r2^j)(N/2^j)=f_rN$$

and by taking into account the variations in N, $$f_r(I-128)<=f_o<=f_r(I+127) \quad (18)$$

Equation 18 corresponds to a peak deviation of approximately $+/-128f_r$. If k represents the magnitude portion of M(nT) and assuming that M(nT) has a unity amplitude centered around zero, then k can be calculated using equations 2 and 10:

$$k=f_{dev}2^j/f_{clk}=128f_r2^j/f_{clk}=128$$

This value is accounted for by subtracting 7 from Y to account for normalization of the modulation value. Extending the above reasoning in a linear time invariant system, for k=128, M(nT) is not shifted so that its LSB is aligned with the LSB of I. In addition, I is offset by −128 to effectively shift M(nT) so that it is centered about zero. Accordingly, for k=256, the LSB of M(nT) is aligned with LSB+1 of I and I is offset by −256 or for k=512, the LSB of M(nT) is aligned with the LSB+2 of I and I is offset by −512.

Thus, in the present case where I=596,523 and k=$2^{14}$=16,384, to compensate for the asymmetrical nature of M(nT), I may be offset by −k, or:

$$I=596{,}523-16{,}384=580{,}139$$

The center frequency offset can be seen by subtracting the center frequency component (equation 7) from the given center frequency, $$f_c = 200 \text{ KHz} - 16,384 f_r = 194,506 \text{ Hz}.$$

As mentioned above, to account for the magnitude of the modulation value, if $k = 2^{14}$, $M(nT)$ can be shifted such that its LSB corresponds to the LSB+7 of I ($Y = 14 - 7 = 7$).

Thus, a DDS system is provided in this example that has linear frequency modulation with a controllable resolution within 1.56% of the desired value by modifying the DDS clock frequency in association with a binary multiplication factor.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention.

I claim:

1. In a direct digital synthesizer operating according to a system clock rate and responsive to a modulation input value for generating a cyclic frequency modulated waveform, a circuit for enhancing system frequency modulation deviation resolution comprising:
   means for bit shifting said modulation input value in order to select frequency modulation deviation, and
   means for varying the system clock rate at which said direct digital synthesizer operates for adjusting said frequency modulation deviation.

2. The circuit according to claim 1 wherein said shifting means comprises a binary shifter receiving said modulation value and a deviation related value for shifting the former in accordance with the latter.

3. The circuit according to claim 1 wherein said means for controlling the system clock rate comprises a frequency rate control means.

4. A direct digital synthesizer that employs a system clock rate and a modulation value to generate a cyclic frequency modulated waveform, said synthesizer comprising:
   means for linearly changing the system clock rate, and
   means for linearly changing the effective modulation value proportionally to linear changes in the system clock rate.

5. The direct digital synthesizer according to claim 4 wherein said means for linearly changing the system clock rate comprises a frequency rate multiplier.

6. In a direct digital synthesizer for producing a frequency modulated output, said synthesizer including an accumulator for receiving an incremental input, and waveform memory means addressed by said accumulator,
   first frequency modulation deviation means for receiving a modulation input and bit shifting said modulation input in accordance with desired deviation,
   means for combining the shifted modulation input with said incremental input, and
   second frequency modulation deviation means for enhancing frequency modulation deviation selection comprising programmable clock source means coupled to said accumulator for controlling its accumulation rate.

7. The direct digital synthesizer according to claim 6 wherein said second frequency modulation deviation means comprises a frequency rate multiplier.

8. A direct digital synthesizer for producing a frequency modulated output comprising:
   an accumulator including a register and an adder for receiving a previous output of said register and adding thereto for updating the contents of the register,
   a memory containing waveform data addressed from said register,
   digital-to-analog converter means receiving the data accessed from said memory,
   a shifter circuit for receiving a modulation value and bit shifting said modulation value to provide a desired frequency modulation deviation and means coupling the output of said shifter circuit to said adder of said accumulator, and
   programmable means for varying the rate of accumulation by said accumulator for adjusting said frequency modulation deviation.

9. The synthesizer according to claim 8 wherein said programmable means comprises a frequency rate multiplier.

10. A method for generating a frequency modulated signal comprising:
    receiving a modulation value and bit shifting said modulation value according to a desired frequency modulation deviation,
    combining the bit shifted modulation value with an increment number representative of frequency, repeatedly accumulating the combination, and employing the accumulation to address waveform lookup values in memory to provide an output, and
    varying the rate of accumulation to adjust said frequency modulation deviation.

11. The method according to claim 10 including filtering said output.

* * * * *